United States Patent
Kim et al.

(10) Patent No.: US 7,129,022 B2
(45) Date of Patent: Oct. 31, 2006

(54) PHOTO-POLYMERIZATION TYPE PHOTO-SENSITIVE ELECTRODE PASTE COMPOSITION FOR PLASMA DISPLAY PANEL AND FABRICATING METHOD THEREOF

(75) Inventors: Sang Tae Kim, Taegu-shi (KR); Seung Tae Park, Kumi-shi (KR); Lee Soon Park, Taegu-shi (KR); Jong Woo Park, Taegu-shi (KR)

(73) Assignee: LG Electronics Inc., Seoul (KR)

( * ) Notice: Subject to any disclaimer, the term of this patent is extended or adjusted under 35 U.S.C. 154(b) by 172 days.

(21) Appl. No.: 10/304,642

(22) Filed: Nov. 27, 2002

(65) Prior Publication Data

US 2003/0215747 A1 Nov. 20, 2003

(30) Foreign Application Priority Data

May 20, 2002 (KR) .................. 10-2002-0027796

(51) Int. Cl.
*G03C 1/725* (2006.01)
*G03C 1/73* (2006.01)
*G03F 7/28* (2006.01)
*G03F 7/32* (2006.01)

(52) U.S. Cl. ................. 430/281.1; 430/284.1; 430/285.1; 430/286.1; 430/287.1; 430/916; 430/905; 430/910; 430/911; 430/311; 430/325; 430/319

(58) Field of Classification Search ........... 430/281.1, 430/285.1, 286.1, 284.1, 916, 905, 910, 911, 430/287.1, 198, 311, 330, 325, 319

See application file for complete search history.

(56) References Cited

U.S. PATENT DOCUMENTS

| | | | | |
|---|---|---|---|---|
| 3,987,127 A * | 10/1976 | Dickie et al. | ............... | 525/287 |
| 5,558,937 A * | 9/1996 | Woods et al. | ............... | 428/378 |
| 5,824,145 A * | 10/1998 | Marganski et al. | ......... | 106/442 |
| 6,054,545 A * | 4/2000 | Oshio et al. | ............... | 527/301 |
| 6,221,454 B1* | 4/2001 | Saito et al. | ............... | 428/64.1 |
| 6,235,458 B1* | 5/2001 | Hashimoto | ................. | 430/533 |
| 6,906,009 B1* | 6/2005 | Shinbach et al. | ........... | 507/117 |
| 2001/0033219 A1* | 10/2001 | Iha et al. | ...................... | 336/90 |
| 2003/0129546 A1* | 7/2003 | Mitsui et al. | ............... | 430/320 |

FOREIGN PATENT DOCUMENTS

EP 0 809 150 A1 * 11/1997

(Continued)

OTHER PUBLICATIONS

Machine-assisted English translation for JP 2002-105112, provided by Japan Patent Office.*

*Primary Examiner*—Sin Lee
(74) *Attorney, Agent, or Firm*—Fleshner & Kim, LLP (57) ABSTRACT

This invention relates to a photo-polymerization type photosensitive electrode paste composition for a plasma display panel that is capable of preventing a bubble from occurring on an electrode surface during an electrode paste printing process and a damage of an electrode pattern caused by adhesive strength reduction, and a method of fabricating the electrode using the same.

A photo-polymerization type photo-sensitive electrode paste composition for a PDP according to the present invention includes a binder polymer for increasing viscosity; at least one of a multi-functional monomer and a multi-functional oligomer that are combined in the shape of chain in reaction to a radical; metal powder; a frit glass for gluing the metal powder; and a photo-initiator and solvent for generating the radical in reaction to a light.

12 Claims, 6 Drawing Sheets

FOREIGN PATENT DOCUMENTS

| | | | |
|---|---|---|---|
| JP | 2002-105112 | * | 4/2002 |
| KR | 000015470 A | | 3/2000 |
| KR | 010004365 A | | 1/2001 |

* cited by examiner

PHOTO-POLYMERIZATION TYPE PHOTO-SENSITIVE ELECTRODE PASTE COMPOSITION FOR PLASMA DISPLAY PANEL AND FABRICATING METHOD THEREOF

BACKGROUND OF THE INVENTION

1. Field of the Invention

This invention relates to a plasma display panel, and more particularly to a photo-polymerization type photosensitive electrode paste composition for a plasma display panel that is capable of preventing a bubble from occurring on an electrode surface during an electrode paste printing process and a damage of an electrode pattern caused by adhesive strength reduction, and a method of fabricating the electrode using the same.

2. Description of the Related Art

Recently, a plasma display panel PDP as a flat panel display device has attracted attention for its easy manufacture in a large size. The PDP uses the phenomenon that a vacuum ultraviolet ray, which has a wavelength of approx. 147 nm emitted from the plasma occurring upon the discharge of inert gases, collides with a fluorescent film to be converted to red, green and blue lights of visible ray. Accordingly, the PDP is capable of displaying full colors, has a rapid response speed and has a wide-viewing angle to make easy realization of a large size display device of which the size is larger than 40 inches so that it attracts attention as one of next generation display devices such as high definition television HDTV etc.

The PDP normally displays a picture by controlling each discharge period of the pixels in accordance with digital video data. In such PDP is typical an alternating type PDP which has three electrodes as shown in FIG. 1 and is driven by an alternating current.

Figure 1:
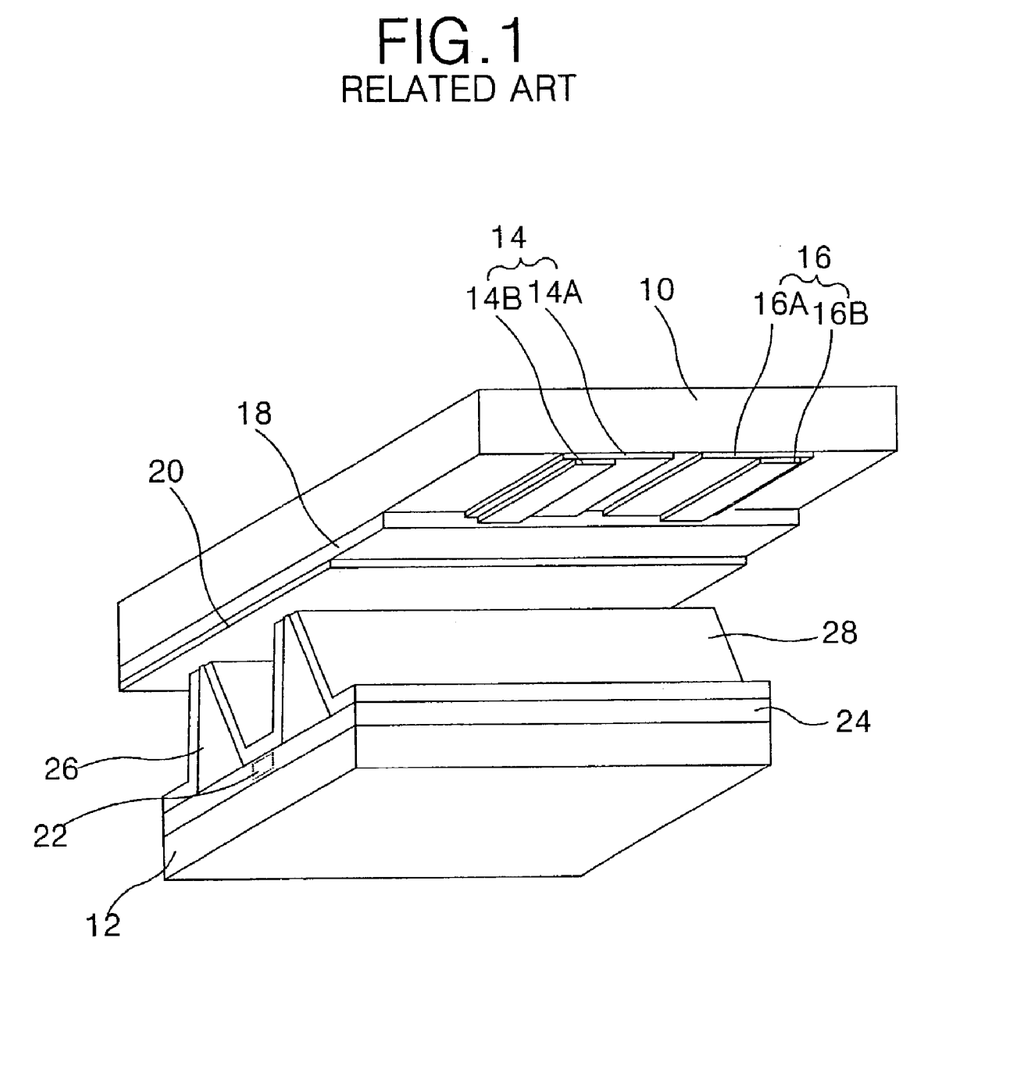
FIG. 1 is a view representing a conventional plasma display panel.

FIG. 1 is a diagram representing a cell structure arranged in the alternating type PDP with the type of matrix.

Referring to FIG. 1, the PDP cell includes an upper plate with a pair of sustaining electrodes 14 and 16, an upper dielectric layer 18 and a protective film 20 that are sequentially formed on an upper substrate 10, a lower plate with an address electrode 22, a lower dielectric layer 24, a barrier rib 26 and a fluorescent layer 28 that are sequentially formed on a lower substrate 12.

The upper substrate 10 and the lower substrate 12 are separated parallel to each other by the barrier rib 26.

Each sustaining electrode pair 14 and 16 includes a transparent electrode 14A and 16A with a relatively broad width and made of transparent electrode material ITO for transmitting visual ray, and a bus electrode 14B and 16B with a relatively narrow width and for compensating the resistance components of the transparent electrode 14A and 16A. Any one of the sustaining electrode pair 14 and 16 plays role of the scanning electrode and another one of the sustaining electrode pair 14 and 16 plays role of the sustaining electrode. The scanning electrode 14 is mainly supplied the scanning signal for the panel scanning and the sustaining signal for keeping the state of discharge. And the sustaining signal is mainly supplied to the sustaining electrode 16.

The wall electric charge, formed upon discharge, is accumulated on the upper dielectric layer 18 and the lower dielectric layer 24. The protective film 20 prevents the damage of the upper dielectric layer 18 by sputtering so as to increase the life of the PDP and to increase the efficiency of emission of the second electron. Magnesium oxide MgO is generally used for the protective film 30.

An address electrode 22 is formed in the direction of crossing the pair of sustaining electrodes 14 and 16. Data signals are supplied to the address electrode 22 for selecting cells to be displayed. The barrier rib 26 is formed parallel to the address electrode 22 and prevents the ultraviolet ray generated by the discharge from being exposed to the adjacent cells. The fluorescent layer 28 is spread on the surface of the barrier rib 26 and the lower dielectric layer 24 and generates one of visual rays among red, green and blue colors. And, inert gas for the gas discharge is injected into the discharge space thereinside.

The bus electrode 14B and 16B of the upper substrate 10 in such a PDP is formed to prevent a voltage drop of the transparent electrodes 14A and 16A, which are formed of Indium Tin Oxide ITO. Because the bus electrodes 14B and 16B shields the light emission to deteriorate brightness of PDP, it is necessary to be as narrow as possible within the limit where the required line resistance is acquired. The bus electrodes 14B and 16B are mainly formed by the vacuum deposition and etching process in the three-layered structure of chromium/copper/chromium. However, the forming method of the bus electrodes 14B and 16B of the three-layered structure of chromium/copper/chromium by the vacuum deposition has some problems that its processing time is long, the thin film forming device and material thereof is high in price and the environment can be contaminated upon etching.

Also, the address electrode 22 is formed by printing method in use of silver paste mainly. But, when forming the electrode by using the paste for printing, the pitch precision of the electrode and the electrode width gets very hard to control. In other words, the spread property becomes deteriorated upon the electrode print, and the adhesive strength to the glass substrate becomes decreased thereby having its resolution deteriorated.

Accordingly, there is required a new PDP electrode forming method which has less loss of the material and is appropriate to high precision by using a photolithography that is capable of forming a minute line width.

SUMMARY OF THE INVENTION

Accordingly, it is an object of the present invention to provide, by including dispersant and multifunctional monomer of urethane acrylate, a photo-polymerization type photosensitive electrode paste composition for a plasma display panel that is capable of preventing a bubble from occurring on an electrode surface during an electrode paste printing process and a damage of an electrode pattern caused by adhesive strength reduction, and a method of fabricating the electrode using the same.

In order to achieve these and other objects of the invention, a electrode paste composition of a plasma display panel according to an embodiment of the present invention includes a binder polymer for increasing viscosity; at least one of a multi-functional monomer and a multi-functional oligomer that are combined in the shape of chain in reaction to a radical; metal powder; a frit glass for gluing the metal powder; and a photo-initiator and solvent for generating the radical in reaction to a light.

The photo-polymerization type photo-sensitive electrode paste composition includes a dispersing agent; and an additive including at least one of a sensitizer for increasing absorptivity of the photo-initiator and an inhibitor for restraining a light to be transmitted to the composition to a specific direction.

In the photo-polymerization type photo-sensitive electrode paste composition, the binder polymer is included with a weight ratio of 5~15 wt % in the photo-polymerization type photo-sensitive electrode paste composition, any one of the multi-functional monomer and the multi-functional oligomer is included with a weight ratio of 8~20 wt % in the photo-polymerization type photo-sensitive electrode paste composition, the metal powder is included with a weight ratio of 54~74 wt % in the photo-polymerization type photo-sensitive electrode paste composition, the frit glass is included with a weight ratio of 2~12 wt % in the photo-polymerization type photo-sensitive electrode paste composition, the photo-initiator is included with a weight ratio of 0.5~2 wt % in the photo-polymerization type photo-sensitive electrode paste composition, and the solvent is included with a weight ratio of 10~23 wt % in the photo-polymerization type photo-sensitive electrode paste composition.

In the photo-polymerization type photo-sensitive electrode paste composition, the additive is included with a weight ratio of 0.5~2 wt % in the photo-polymerization type photo-sensitive electrode paste composition.

In the photo-polymerization type photo-sensitive electrode paste composition, the binder polymer includes an acrylic binder and a cellulose binder.

In the photo-polymerization type photo-sensitive electrode paste composition, the binder polymer includes any one of cellulose derivatives of Ethyl cellulose, Hydroxyethyl cellulose, Hydroxypropyl cellulose and Hydroxyethlyhydroxypropyl cellulose.

In the photo-polymerization type photo-sensitive electrode paste composition, the multi-functional monomer or the multi-functional oligomer include Urethane acrylate.

In the photo-polymerization type photo-sensitive electrode paste composition, the additive includes 2,4,6-trimethylphenol.

In the photo-polymerization type photo-sensitive electrode paste composition, the photo-initiative makes the photo-polymerization type photo-sensitive electrode paste composition react to the light of the range of 200~400 nm.

A method of fabricating an electrode of a PDP using a photo-polymerization type photo-sensitive electrode paste composition according to another aspect of the present invention includes steps of printing the photo-polymerization type photo-sensitive electrode paste including a binder polymer, any one of a multi-functional monomer and a multi-functional oligomer, metal powder, a frit glass, a photo-inintiator and solvent onto a substrate; drying the electrode paste; lining up a photo-mask on the dried electrode paste and exposing the electrode paste through the photo-mask; developing the exposed electrode paste with development solution; and plasticizing the developed electrode paste.

In the method, the photo-polymerization type photo-sensitive electrode paste includes an additive including at least one of a sensitizer, an inhibit and a dispersing agent.

In the method, in the step of drying the electrode paste, the electrode paste is heated in the temperature range of 50~130° C. for 5~30 minutes and in the step of plasticizing the electrode paste, the electrode paste is heated in the temperature range of 450~600° C.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

With reference to FIGS. 2 to 5b, there is explained a preferred embodiment of the present invention as follows.

Figure 2:
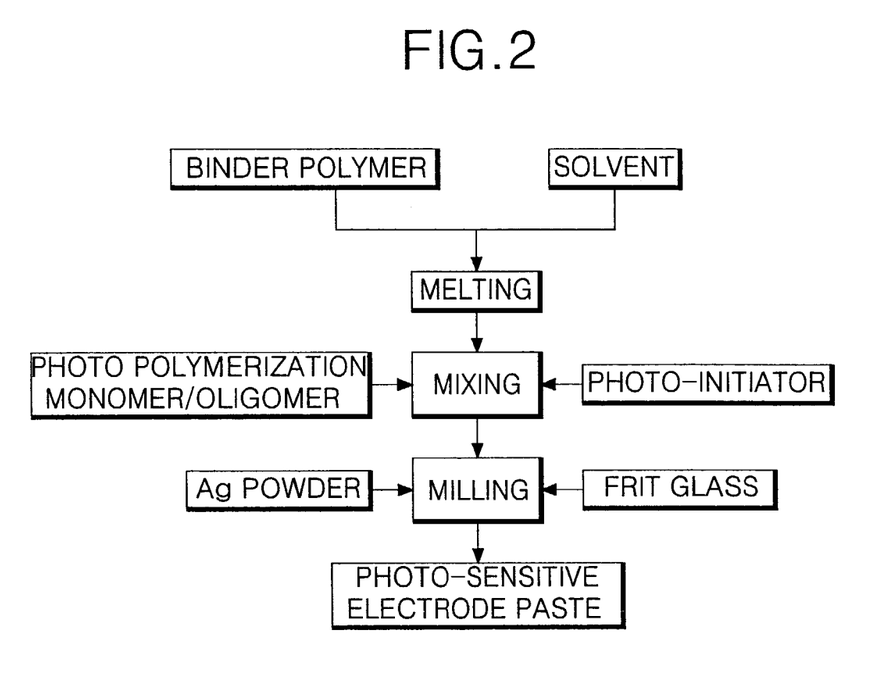
FIG. 2 is a view representing a method of fabricating a photo-polymerization type photosensitive electrode paste according to a first embodiment of the present invention.

Referring to FIG. 2, a photo-polymerization type photo-sensitive electrode paste composition according to the present invention includes cellulose derivative and acrylic binder polymer, urethane-acrylic oligomer, and silver Ag powder and frit glass distributed in the photo-sensitive vehicle that includes ultraviolet photo-initiator.

The binder polymer is included into the photo-sensitive electrode paste composition with the weight ratio of 5~15 wt %. The binder polymer increases viscosity and improves development property. And if it is exposed to ultraviolet, it has a characteristic of being cross-linked. If the viscosity of the electrode paste composition becomes too low, it becomes difficult to be spread because of the occurrence of bubble or other causes. Contrary to this, if it is too high, the paste is very hard to pass through a screen mesh so that the screen mesh is blocked, that is, the characteristic of being spread becomes bad to have the electrode difficult to be formed.

The present invention improves the occurrence of the pin hole due to the bubble generated upon printing by adding cellulose binder besides acrylic binder into the electrode paste composition for the appropriate viscosity control and dispersibility, and improves the electrode characteristic by means of the regular spread on the surface.

The binder polymer plays role of dispersing and combining the metal electrode material forming the electrode and plays role of controlling the viscosity. It can be used together with polymers that have a good compound property with the multifunctional monomer or oligomer. The binder polymer can be used together with cellulose derivatives such as ethyl cellulose, hydroxyethyl cellulose, hydroxypropyl cellulose or hydroxyethlyhydroxypropyl cellulose for the improvement of the printing characteristic besides the acrylic binder photo-polymerized with acrylic monomer. Such cellulose derivatives, together with the acrylic binder, make it possible to be plasticized at the low temperature of around 480° C. at the final plasticization stage of forming electrode.

The multifunctional monomer and oligomer reacts on the radical to be combined in the shape of chain. The monomer is a simple molecule and the oligomer has bigger molecular weight than the monomer but plays the same role as the monomer. In use of the oligomer of the urethane acrylate besides the multi-functional monomer for controlling the adhesive strength to the glass substrate and the appropriate development time, the adhesive strength to the glass substrate and TTC (time to clear) upon development are increased to broaden the process margin. Any one between the multi-functional monomer and the oligomer is included by the weight ratio of 8~20 wt % to the photo-sensitive electrode paste composition. For the multi-functional monomer, one can be used which is selected among a group consisting of two multi-functional monomer or three multi-functional monomer and 5, 6 multi-functional monomer, and multi-functional oligomers of urethane acrylate used for the increase of TTC and the adhesive strength to the glass substrate.

Silver powder is included in the photo-sensitive electrode paste composition with the weight ratio of 54~74 wt %.

The frit glass plays role of increasing the adhesive strength to the substrate as well as gluing metal powder that is silver paste. Because the conductivity of the composition drops if the electrode paste composition includes too much frit glass, it is to be included with the weight ratio of 2~12 wt %.

The photo-initiator reacts on the ultraviolet ray to generate the radical, and is included to the photo-polymerization type photo-sensitive electrode paste composition with the weight ratio of 0.5~2 wt %. The photo-initiator can be any photo-initiator that shows good photo-reaction in the wavelength range of 200~400 nm, and is a single or a mixed photo-initiator being mixed with two or other photo-initiators.

In case of using the mixed photo-initiator, because it has a crosslinking capability in a various wavelength area, an excellent fluorescent film pattern.

A solvent is included in the photo-polymerization type photo-sensitive electrode paste composition with the weight ratio of 10~23 wt %. For the solvent, one or more among ones having its boiling point larger than 100° C., can be selected to be used.

Various additives such as senstizer, UV stabilizer, dispersing agent, antifoaming agent, smoothing agent, antioxidant and inhibitor, can be used for improving the fluidity characteristics and the process characteristics of the photo-sensitive electrode paste. Theses are all well known of being commonly bought and used to those who have general knowledge in the concerned technical field. Herein, the sensitizer is a catalyst for easing the absorption of the UV ray. The inhibit restrains that the reaction by the UV ray is transmitted to the horizontal direction of the composition.

In FIG. 2 is shown the method of fabricating the photo-polymerization type photo-sensitive electrode paste composition. First of all, the binder polymer is dissolved in solvent in order to have optimum viscosity. Afterwards, a photo-sensitive vehicle is made by mixing the photo-initiator, the oligomer and the multi-functional photo-sensitive monomer including more than two double bonds. After putting silver Ag powder and glass frit powder into the photo-sensitive solution, this mixture is dispersed by a three-roll mill of metal uniformly to complete the photo-polymerization type photo-sensitive electrode paste composition.

Figure 3:
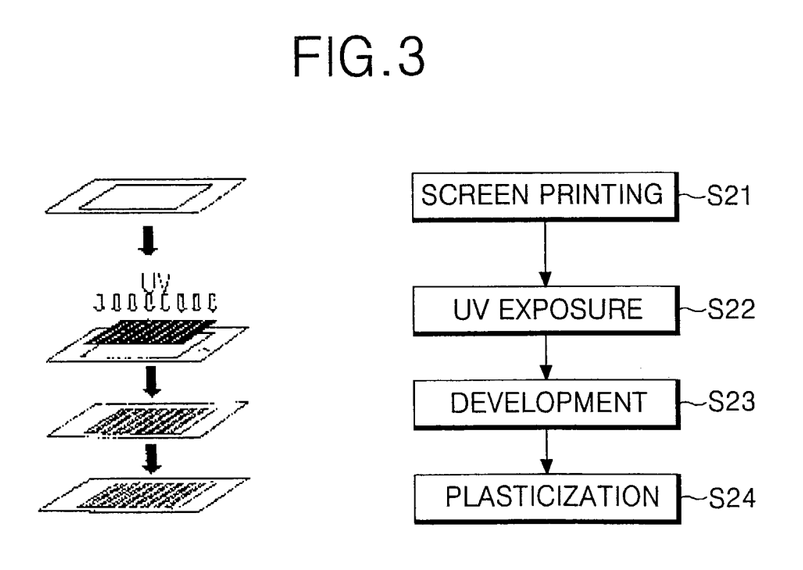
FIG. 3 is a view representing a method of forming address electrode in use of the electrode paste of FIG. 2.

An address electrode can be fabricated, as shown in FIG. 3, in use of the photo-sensitive electrode paste composition. As in FIG. 3, after printing the whole surface with the photo-sensitive electrode paste on the lower substrate in use of the screen printer, it is dried at 100° C. for 20 minutes. (S21) Then, after lining up the photo-mask corresponding to the next electrode pattern, the UV ray generated in the high-pressure mercury lamp is irradiated in the range of light exposure volume 200~500 mJ/cm$^2$ to have the photo-sensitive electrode paste photo-reacted. (S22) Then, $Na_2CO_3$ alkali aqueous solution of 0.3~0.5 wt %, a development solvent, is sprayed for 20~30 seconds to eliminate a non-exposed area. (S23) The temperature of glass substrate where the electrode pattern is formed is increased to 560° C. by 10° C./min and kept at 560° C. for 30 minutes. (S24) Through this process, the multi-functional monomer crosslinked with the binder polymer being included in the electrode pattern is pyrolyzed to be eliminated, thereby obtaining the electrode pattern consisting of only silver Ag powder and glass frit.

Figure 4A:
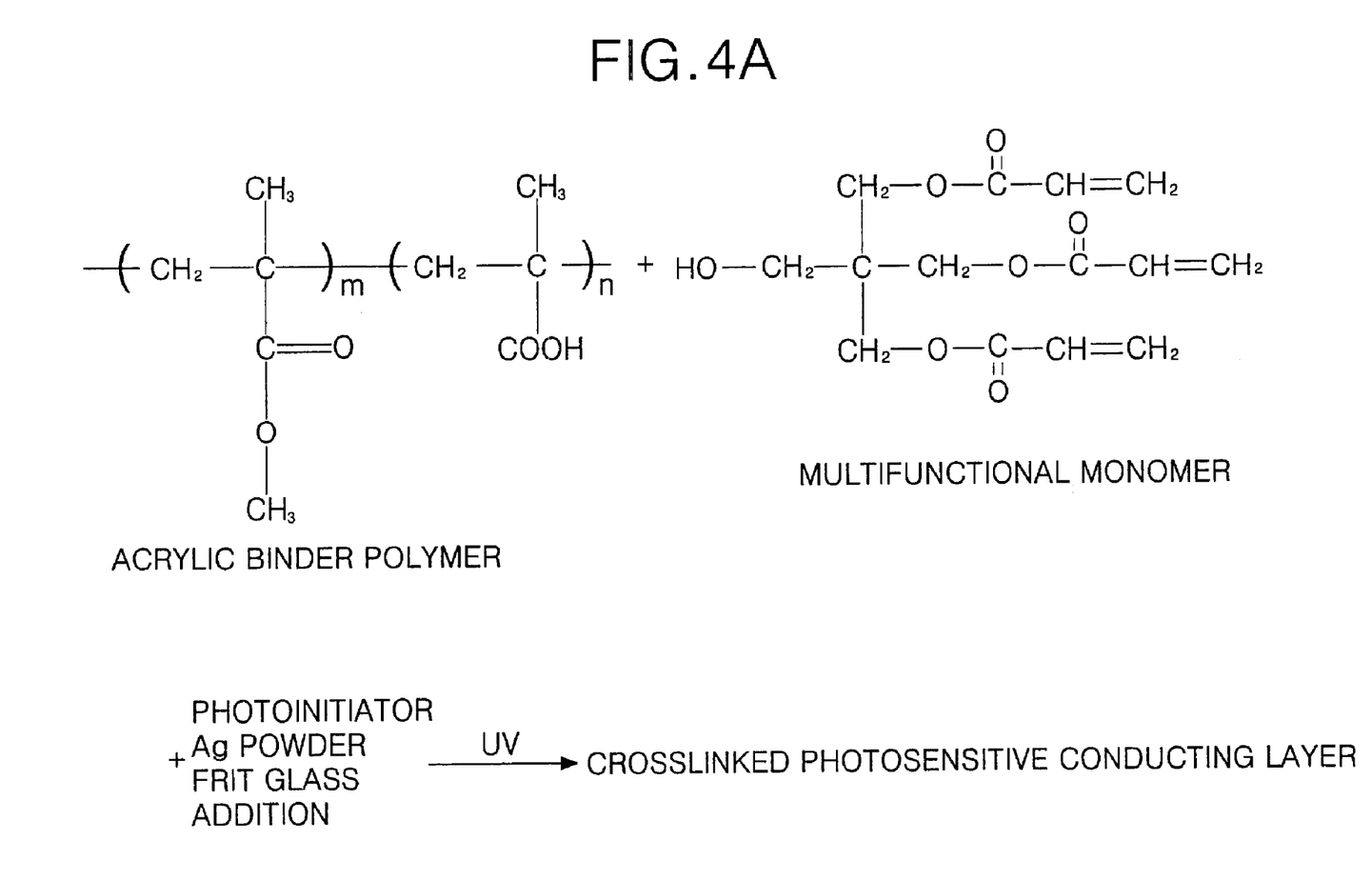
FIGS. 4A and 4B are views representing a mechanism of forming the electrode of a plasma display panel.
Figure 4B:
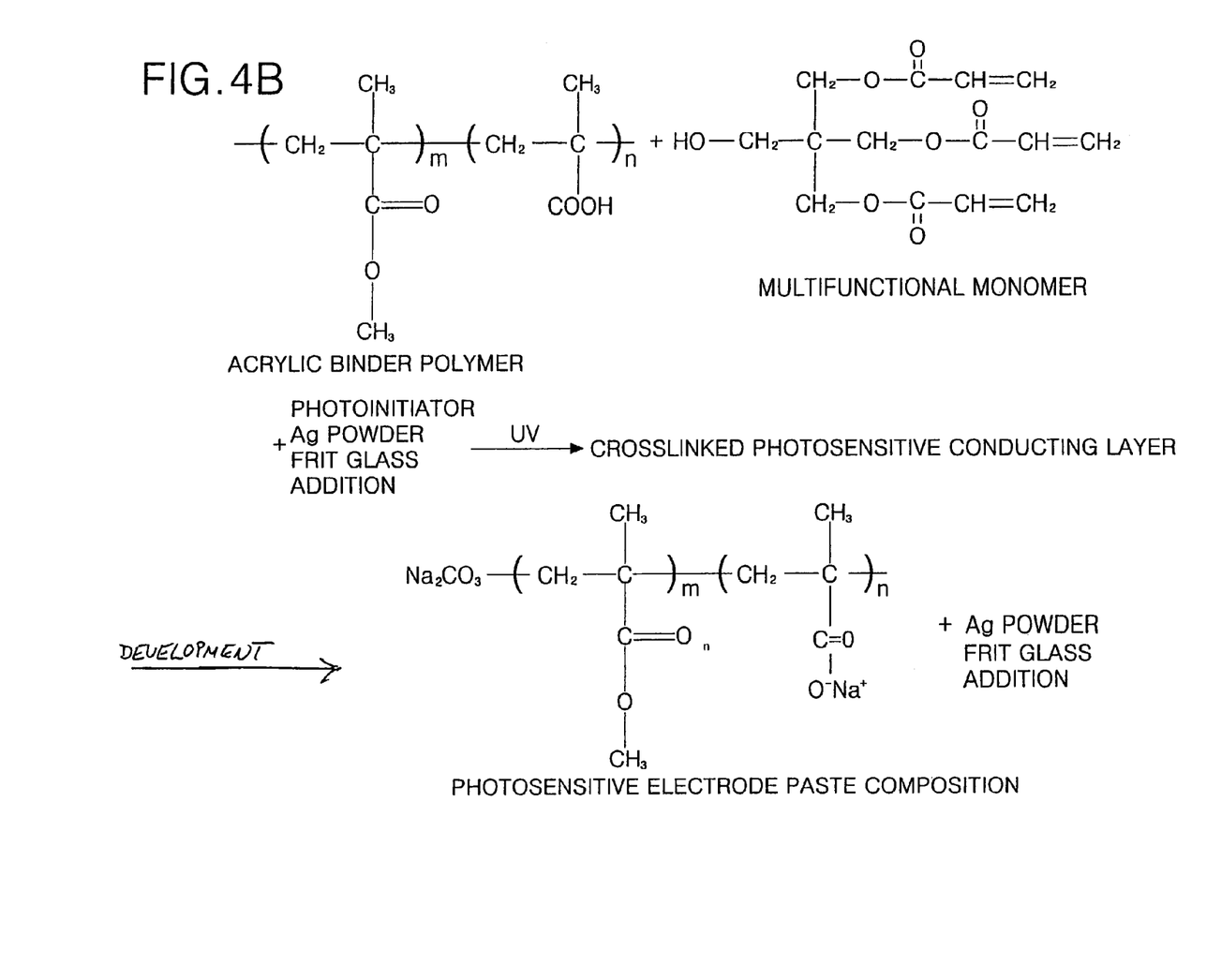

FIGS. 4A and 4B represent a brief mechanism of forming the electrode pattern of a plasma display panel in use of the photo-sensitive electrode paste.

First of all, if a photo-initiator, a sensitive emulsion, is exposed to the UV ray, it is resolved to form a free radical, and this active radical attacks the double bond of the multi-functional monomer or the UV oligomer to cause a polymerization. At this moment, since the multi-functional monomer or the UV oligomer have more than two double bonds in one molecule, if polymerization proceeds, a polymer of three dimensional network is formed so as not to be developed in a developing solution.

On the other hand, because the area not exposed to the UV ray is eliminated together with silver Ag, which is inorganic substance, the glass frit powder and the non-reacted multi-functional monomer, a minute electrode pattern can be formed separately from the exposed area when the binder polymer is dissolved in an alkali aqueous solution in a development process.

Table 1 represents the composition and process characteristics of the photo-sensitive electrode paste for forming the address electrode of the traditional PDP.

In case of manufacture examples 1 and 2 of the Table 1, acrylic alone is used for the binder polymer. If the acrylic is used alone, a hole is generated by the considerably large number of bubbles when printing paste so that the electrode surface is not only uneven but also it becomes the cause for the short circuit of the electrode after being plasticized. Therefore, if cellulose with a good Theological property is added besides the acrylic binder for eliminating the bubble generated upon printing and increasing the regularity of the surface, such characteristics is improved so that the surface is regular and no pin hole is generated, thereby the electrode pattern without short circuit can be obtained after being plasticized. Also, in case of the multi-functional monomer being used alone in the manufacture examples 1 and 2, there is shortened the TTC (Time To Clear) which controls a process margin upon development owing to the lessened adhesive strength to the glass substrate, but if the multi-functional oligomer such as urethan acrylate besides the multi-functional monomer is added, the adhesive strength to the glass substrate is increased to lengthen the TTC thereby broadening the process margin.

The photo-polymerization type photo-sensitive electrode paste composition for PDP according to the present invention which is capable of forming the electrode by the photo-etching is of a basic composition of additives such as metal electrode material forming electrode after being plasticized, the frit glass, the binder polymer, the multi-functional monomer or oligomer, UV ray photo-initiator, the solvent and dispersing agent, and the sensitizer and inhibit to be photo-reacted, thereby forming the electrode through the mechanism of the photo-polymerization type.

And it is of a basic composition of additives such as the multi-functional monomer or oligomer, UV ray photo-initiator, the solvent and dispersing agent, and the sensitizer to be photo-reacted, thereby forming the electrode through the mechanism of the photo-polymerization type. Accordingly there is spread the frit glass and the metal electrode material consisting of approx. 54~74 wt % of the whole photo-polymerization type photo-sensitive electrode paste composition in weight, and it is hardened by light exposure and capable of making a thick film of 3~10 μm hardened within a short time after being plasticized to form an electrode pattern of an appropriate thick film to the PDP.

Also, the electrode forming method in use of the photo-polymerization type photo-sensitive electrode paste composition for the PDP according to the present invention includes in weight 5~15 wt % of the binder polymer including cellulose binder and acrylic binder, 8~20 wt % of the multi-functional monomer or oligomer, 54~74 wt % of the metal electrode material, 2~12 wt % of the frit glass, 0.5~2 wt % of the photo-initiator, 0.5~2 wt % of the additives such as the sensitizer or inhibit, and 10~23 wt % of the solvent. The pattern forming method thereof includes a printing stage of spreading the photo-sensitive electrode paste composition on the glass substrate into the film of 10~30 μm, a drying stage of applying heat to dry for 5~30 minutes in the temperature range of 50~130° C., an exposing stage of exposing the dried film to the UV ray in use of the photo-mask, a developing stage of forming the electrode pattern with the alkali development solution on the film where the pattern is formed, and a plasticization stage of plasticizing the film where the electrode is formed with the temperature of 450~600° C.

The photo-polymerization type photo-sensitive electrode paste composition is printed by a screen printer and the printed film is dried in an oven. Then, the photo-mask is lined up on the dried film, it is exposed to the UV ray to be hardened, and it is selectively eliminated by the development solution to form electrodes. The patterned electrode is plasticized in the plasticization device with the temperature of 450~60° C. to keep only the metal electrode material and to eliminate the organic part thereby leaving only the electrode.

In the printing stage, the film of the photo-polymerization type photo-sensitive electrode paste composition is formed on the glass substrate with the thickness of 10~30 μm by the screen printer.

In the drying stage, the film of the paste composition is dried at a dry stand.

In the exposing stage, the dried paste composition is placed under the photo-mask to be exposed to the UV ray by the exposing device so that the paste composition is made to harden by the photo-polymerization due to this.

In the plasticization stage, the heat is applied to it with the temperature of 450~600° C. in the plasticization device to eliminate the organic part, and the only metal electrode material is left on the glass substrate so that there can be obtained the electrode formed in the predetermined shape.

For this, the electrode paste composition formed with the electrode like the photo-polymerization type photo-sensitive electrode paste composition for PDP according to the present invention should be hardened by sufficient polymerization by means of the UV ray irradiation. That is, the photo-initiator of the photo-polymerization type photo-sensitive electrode paste composition according to the present invention is resolved by the light exposure to form the free radical, and the free radical combines the unsaturated double bonds of the multi-functional monomer or oligomer in the chain polymerization reaction to form a giant polymer with the three dimensional network structure so that the electrode structure exposed to the UV ray is not deformed at the high temperature just before plasticization.

The importance of such a photo-polymerization type photo-sensitive electrode paste composition is that the photo-crosslinking type photo-sensitive composition for the conventional television Braun tube of PVA-ADC type only makes crosslinking reaction at the area exposed to the UV ray to be hardened, on the contrary, it can be hardened to more thicker film. That is, the metal electrode material powder consists of more than 50 wt % of the photo-sensitive electrode paste composition, and the powder exist in the shape of spherical minute mass with the size of smaller than 5 μm in the electrode structure having a thickness of 10~30 μm. Especially, there is a tendency of the printing characteristics becomes bad because of the occurrence of bubble due to the change of viscosity in the process of printing the photo-sensitive electrode paste onto the glass substrate, however, in the present invention, this can be complementary by adding cellulose binder.

Also, due to the lack of the adhesive strength to the glass substrate, a lot of the electrode patterns fall off after the development or the resolution tends to be deteriorated, but in the present invention these problem can not only be solved by bring in the oligomer of the urethane acrylate except the multi-functional monomer, but also TTC be increased.

The present invention is more particularly explained through the preferred embodiments and comparison examples of this invention in the following. The following embodiments are only for exemplifying this invention and should not to be understood as limiting the scope of the present invention.

TABLE 1

|  | Manufacture example 1 (Comparison 1) | Manufacture example 2 (Comparison 1) | Manufacture example 3 (Embodiment 2) |
|---|---|---|---|
| Acrylic Binder | 1.2 g | 1.2 g | 1.2 g |
| Solvent | 1.8 g | 1.8 g | 1.8 g |
| Multi-functional monomer and oligomer (EB-204) | 1.56 g (monomer) | 1.72 g (monomer) | Monomer: 1.25 g Oligomer: 0.42 g |
| Photo-initiator | 0.23 g | 0.28 g | 0.24 g |
| Inhibit | 0.16 g | 0.16 g | 0.16 g |
| Dispersing agent | 0.15 g | 0.15 g | 0.15 g |
| Ag powder | 8.21 g | 9.4 g | 8.85 g |
| Frit glass | 0.59 g | 0.46 g | 0.68 g |
| Resolution | 50~60 μm | 50~60 μm | 20~30 μm |
| Thickness after plasticization | 7.2 μm | 7.8 μm | 8.1 μm |
| Characteristics | Occurrence of orange peel | Occurrence of orange peel | Occurrence of orange peel |
| TTC (phenomenon) | 18 Sec | 19 Sec | 33 Sec |
| Total | 13.75 g | 15.02 g | 14.60 g |

TABLE 2

|  | Manufacture example 4 (Embodiment 1, Comparison 2) | Manufacture example 5 (Embodiment 1, Comparison 2) | Manufacture example 6 |
|---|---|---|---|
| Acrylic Binder | 1.2 g | 1.2 g | 1.2 g |
| Solvent | 1.8 g | 1.8 g | 1.8 g |
| Multi- | 1.56 g | 1.72 g | Monomer: |

TABLE 2-continued

| | Manufacture example 4 (Embodiment 1, (Comparison 2) | Manufacture example 5 (Embodiment 1, (Comparison 2) | Manufacture example 6 |
|---|---|---|---|
| functional monomer and oligomer | (monomer) | (monomer) | 1.25 g |
| (EB-204, a urethane acrylate oligomer) | | | Oligomer: 0.42 g |
| Cellulose (HPC) binder | 0.24 g | 0.35 g | 0.35 g |
| Photo-initiator | 0.23 g | 0.28 g | 0.24 g |
| Inhibit | 0.16 g | 0.16 g | 0.16 g |
| Dispersing agent | 0.15 g | 0.15 g | 0.15 g |
| Ag powder | 8.21 g | 9.4 g | 8.85 g |
| Frit glass | 0.59 g | 0.46 g | 0.68 g |
| Resolution | 50~60 μm | 50~60 μm | 20~30 μm |
| Thickness after plasticization | 7.2 μm | 7.8 μm | 8.1 μm |
| Characteristics | Occurrence of orange peel, though not much | No Bubble Occurrence | No Bubble Occurrence |
| TTC (phenomenon) | 18 Sec | 19 Sec | 33 Sec |
| Total | 13.75 g | 15.02 g | 14.60 g |

To explain regarding the comparison 1, the photo-polymerization type photo-sensitive electrode paste composition is uniformly dispersed for 2~3 hours in use of a mixer (three roll mill) with the composition of the Table 1 to be fabricated. The photo-sensitive electrode paste is printed into a film with a thickness of 10~30 μm in use of the screen printer on the glass substrate, then is dried, and is exposed to the UV ray with a photo-strength of 6.8 mW/cm² for 30~100 seconds having a photo-mask therebetween.

In the manufacture example 1 to 3, a lot of bubbles are generated on the electrode surface after printing the electrode paste, its leveling is no good through the time passes by, and the surface like the shape of orange skin appears roughly after being dried out completely. Also, some area where the bubble occurs appears in the shape of hole after being dried. The irregularity of such a surface continuously appears after dry, light exposure and development, and especially because such a characteristics after plasticization can bring the difference of a resistance when forming the electrode pattern for PDP that requires a minute pattern, it is apparent that the composition is not appropriate. Particularly the resolution is far better in manufacture example 3 than in manufacture example 1 and 2.

The photo-polymerization type photo-sensitive electrode paste according to the first embodiment of the present invention shows the composition ratio in the Table 2, in which HPC (hydro propyl cellulose), a cellulose derivatives, is added to the composition of the Table 1, in order to eliminating the bubble generated upon printing, which was the problem shown in the comparison 1, and maintaining the uniformity of the surface. The photo-sensitive electrode paste is fabricated in the composition ratio of the Table 2, then the electrode pattern is formed after printing, drying, light exposure, and development. There is observed uniform print characteristics of its surface having no orange peel phenomenon after printing, which was shown in the comparison 1.

However, in manufacture example 4 of the Table 2, though it not much, there was an orange peel printing shape observed due to the a bit of bubble occurrence. But there can be obtained a uniform surface without any occurrence of bubble in case of manufacture 5 and 6 to witch a lot of HPC is added.

To explain the comparison 2, the photo-sensitive electrode paste fabricated in the composition of manufacture 5 of the Table 2 has no bubble occurrence and the uniform surface without any orange peel phenomenon formed, but the development is done very short time in the development process. This is that because HPC includes hydroxyl (—OH) in its structure, the development occurs too quickly (TTC is very short) to the development solution, alkali aqueous solution $Na_2CO_3$, if the development time and condition is not appropriate, the binder falls off to lessen the sharpness of the pattern and because the process margin is short, it is difficult to apply to the actual process. Generally, the development condition in the actual process is approximately double of the TTC due to the afterimage and the process margin and the TTC is normally 20~40 seconds.

Figure 5A:
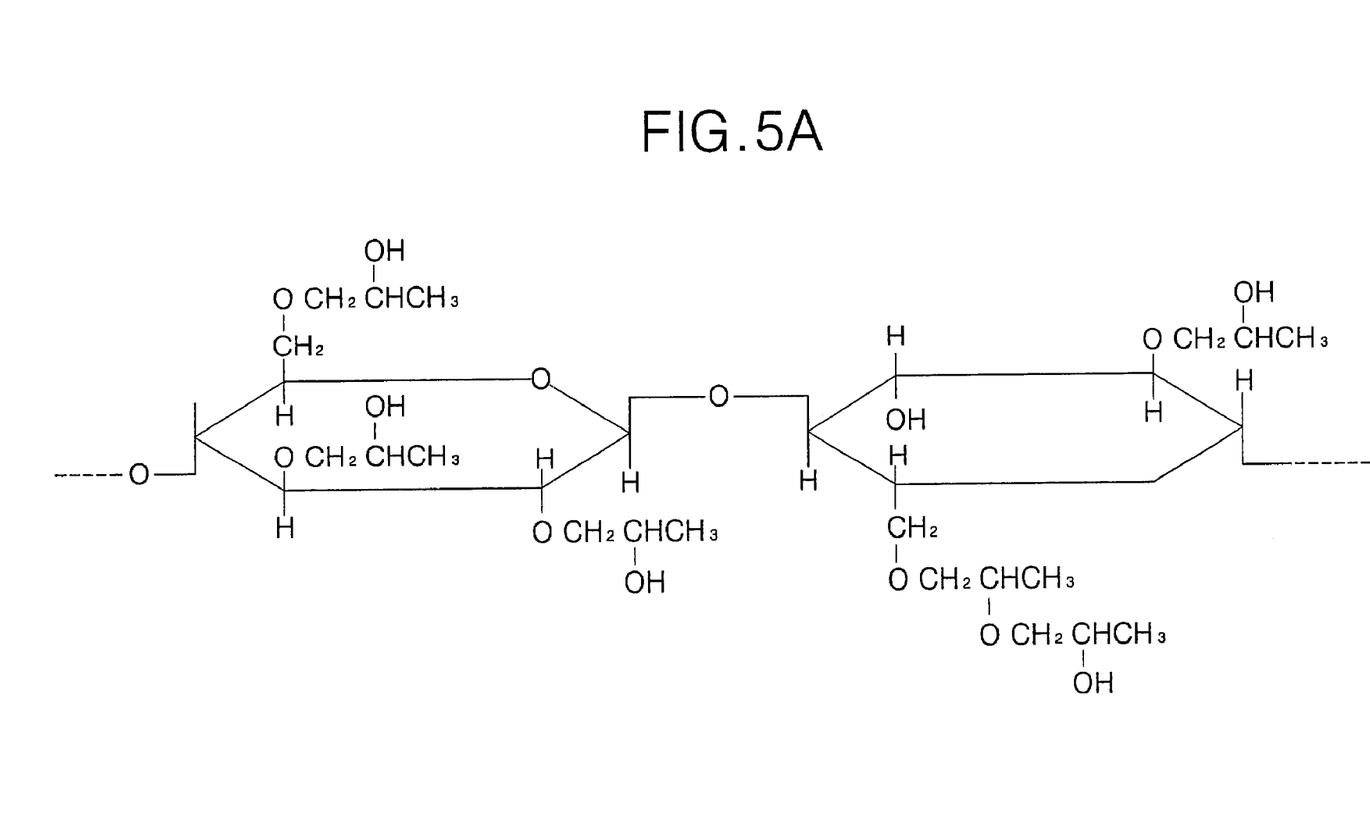
FIGS. 5A and 5B are a view representing the structure of HPC and EB-294 included in the photo polymerization type display panel in accordance with another second embodiment of the present invention.
Figure 5B:
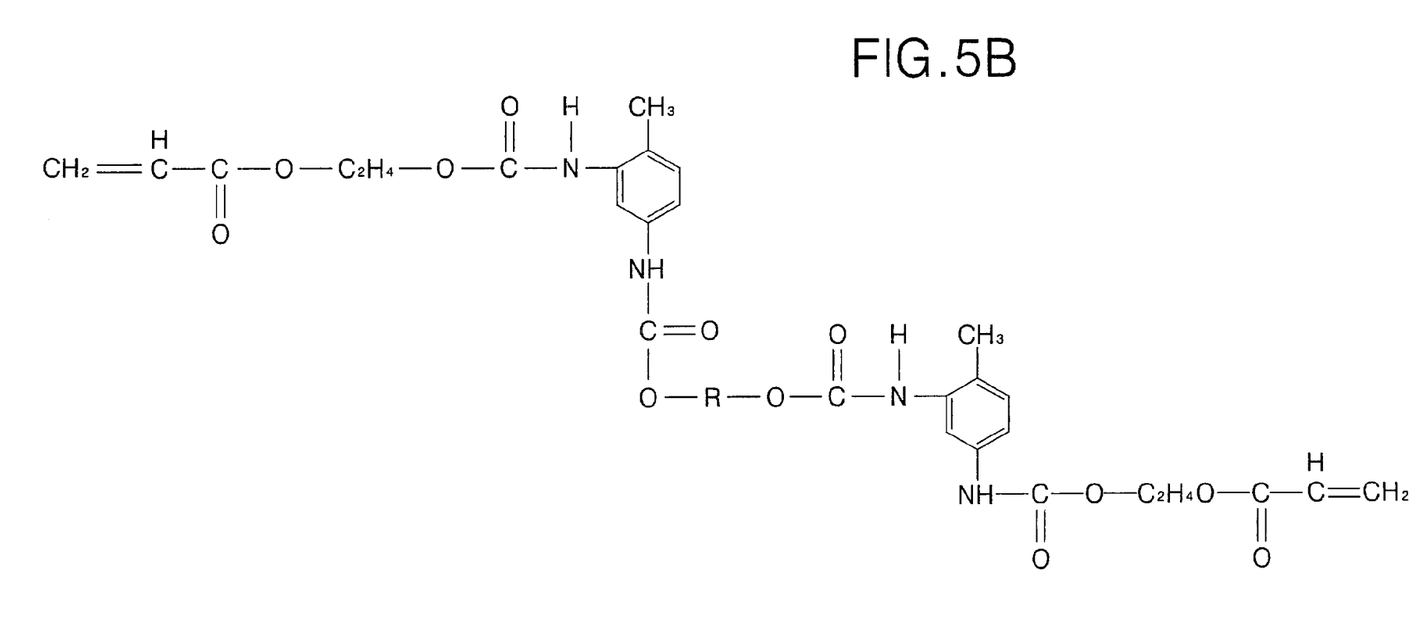

The photo-polymerization photo-sensitive electrode paste according to the second embodiment of the present invention is fabricated by adding the multi-functional oligomer EB-204 and the HPC (hydroxy proply cellulose) illustrated in FIGS. 5A and 5B in order to resolve the irregularity of the surface due to the generated bubble upon printing and to increase the TTC for widening the process margin. The photo-polymerization type photo-sensitive electrode paste composition is fabricated by uniformly dispersing for 2~3 hours in use of the mixer (three roll mill) in the composition of manufacture example 6. This photo-sensitive electrode paste is printed into a film with its thickness of 10~30 μm in use of the screen printer onto the glass substrate, then dried, then exposed to the UV ray for 30~100 seconds with a photo-strength of 6.8 mW/cm2. When examining the shape of the exposed electrode with an optical microscope, it is uniformly formed within deviation of 1% in comparison with the average height of the electrode and its width can be formed upto 30 μm of resolution. Therefore, there can be obtained an electrode with an excellent pattern consisting of only inorganic substances by plasticizing at the plasticization temperature of maximum 580° C.

The EB 204 is urethane acrylate oligomer and plays role of crosslinking upon the photo-polymerization together with the multi-functional monomer to increase the adhesive strength to the glass substrate and increase the TTC to broaden the process margin thereby increasing the resolution.

As described above, the photo-polymerization type photo-sensitive electrode paste composition and a method of fabricating the electrode using the same, can resolve the problem of bubble occurrence upon printing differently from forming the electrode in use of the conventional printing method and the acrylic binder. Also, the photo-polymerization type photo-sensitive electrode paste composition and a method of fabricating the electrode using the same can maintain high resolution through the increase of the adhesive strength onto the glass substrate. Especially, the photo-polymerization type photo-sensitive electrode paste composition and a method of fabricating the electrode using the same can have better pattern upon forming the electrode than in the conventional way of forming the electrode by only using the acrylic binder.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A photo-polymerization type photo-sensitive electrode paste composition for a plasma display panel (PDP), comprising:
a binder polymer for increasing viscosity, wherein the binder polymer includes an acrylic binder and a cellulose binder;
at least one multi-functional monomer and at least one multi-functional oligomer that are combined in the shape of chain in reaction to a radical, wherein the multi-functional monomer and/or the multi-functional oligomer includes urethane acrylate;
metal powder;
a frit glass for gluing the metal powder;
a photo-initiator for generating the radical in reaction to a light;
a solvents;
a dispersing agent; and
an additive including at least one of a sensitizer for increasing absorptivity of the photo-initiator and an inhibitor for restraining a light to be transmitted to the composition to a specific direction.

2. The photo-polymerization type photo-sensitive electrode paste composition according to claim 1, wherein the binder polymer is included with a weight ratio of 5~15wt % in the photo-polymerization type photo-sensitive electrode paste composition, the multi-functional monomer and the multi-functional oligomer are included with a weight ratio of 8~20wt % in the photo-polymerization type photo-sensitive electrode paste composition, the metal powder is included with a weight ratio of 54~74wt % in the photo-polymerization type photo-sensitive electrode paste composition, the frit glass is included with a weight ratio of 2~12wt % in the photo-polymerization type photo-sensitive electrode paste composition, the photo-initiator is included with a weight ratio of 0.5~2wt % in the photo-polymerization type photo-sensitive electrode paste composition, and the solvent is included with a weight ratio of 10~23wt % in the photo-polymerization type photo-sensitive electrode paste composition.

3. The photo-polymerization type photo-sensitive electrode paste composition according to claim 1, wherein the additive is included with a weight ratio of 0.5~2wt % in the photo-polymerization type photo-sensitive electrode paste composition.

4. The photo-polymerization type photo-sensitive electrode paste composition according to claim 1, wherein the binder polymer includes at least one member selected from the group consisting of ethyl cellulose, hydroxyethyl cellulose, hydroxyprcpyl cellulose and hydroxyethyl hydroxypropyl cellulose.

5. The photo-polymerization type photo-sensitive electrode paste composition according to claim 1, wherein the additive is 2,4,6-trimethylphenol.

6. The photo-polymerization type photo-sensitive electrode paste composition according to claim 1, wherein the photo-initiator makes the photo-polymerization type photo-sensitive electrode paste composition react to the light of the range of 200~400nm.

7. A photo-polymerization type photo-sensitive electrode paste composition for a plasma display panel (PDP), comprising:
a binder polymer for increasing viscosity, wherein the binder polymer comprises an acrylic binder and a cellulose binder;
at least one of a multi-functional monomer and a multi-functional oligomer that are combined in the shape of chain in reaction to a radical, wherein the multi-functional monomer or the multi-functional oligomer includes urethane acrylate;
metal powder;
a frit glass for gluing the metal powder;
a photo-initiator for generating the radical in reaction to a light;
a solvent;
a dispersing agent; and
an additive including at least one of a sensitizer for increasing absorptivity of the photo-initiator and an inhibitor for restraining a light to be transmitted to the composition to a specific direction.

8. The photo-polymerization type photo-sensitive electrode paste composition according to claim 7, wherein the binder polymer is included with a weight ratio of 5~15wt % in the photo-polymerization type photo-sensitive electrode paste composition, any one of the multi-functional monomer and the multi-functional oligomer is included with a weight ratio of 8~20wt % in the photo-polymerization type photo-sensitive electrode paste composition, the metal powder is included with a weight ratio of 54~74wt % in the photo-polymerization type photo-sensitive electrode paste composition, the frit glass is included with a weight ratio of 2~12wt % in the photo-polymerization type photo-sensitive electrode paste composition, the photo-initiator is included with a weight ratio of 0.5~2wt % in the photo-polymerization type photo-sensitive electrode paste composition, and the solvent is included with a weight ratio of 10~23wt % in the photo-polymerization type photo-sensitive electrode paste composition.

9. The photo-polymerization type photo-sensitive electrode paste composition according to claim 7, wherein the additive is included with a weight ratio of 0.5~2wt % in the photo-polymerization type photo-sensitive electrode paste composition.

10. The photo-polymerization type photo-sensitive electrode paste composition according to claim 7, wherein the cellulose binder comprises at least one member selected from the group consisting of ethyl cellulose, hydroxyethyl cellulose, hydroxyprcpyl cellulose and hydroxyethyl hydroxypropyl cellulose.

11. The photo-polymerization type photo-sensitive electrode paste composition according to claim 7, wherein the additive is 2,4,6-trimethylphenol.

12. The photo-polymerization type photo-sensitive electrode paste composition according to claim 7, wherein the photo-initiator makes the photo-polymerization type photo-sensitive electrode paste composition react to the light of the range of 200~400 nm.

* * * * *